US007683291B2

(12) United States Patent
Hayasaki et al.

(10) Patent No.: US 7,683,291 B2
(45) Date of Patent: Mar. 23, 2010

(54) SUBSTRATE PROCESSING METHOD AND MANUFACTURING METHOD OF SEMICONDUCTOR DEVICE

(75) Inventors: Kei Hayasaki, Kamakura (JP); Tsuyoshi Shibata, Kikuchi-gun (JP); Koutarou Sho, Yokohama (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 766 days.

(21) Appl. No.: 11/411,139

(22) Filed: Apr. 26, 2006

(65) Prior Publication Data

US 2006/0289431 A1 Dec. 28, 2006

(30) Foreign Application Priority Data

Apr. 26, 2005 (JP) ............................ 2005-128230

(51) Int. Cl.
*A21B 1/00* (2006.01)
*C23C 16/00* (2006.01)

(52) U.S. Cl. ....................... 219/399; 219/390; 219/405; 219/411; 118/724; 118/725; 118/50.1; 118/715

(58) Field of Classification Search ................. 219/390, 219/399, 405, 411; 118/724, 725, 50.1, 715
See application file for complete search history.

(56) References Cited

U.S. PATENT DOCUMENTS

2003/0041971 A1 * 3/2003 Kido et al. ............. 156/345.33

FOREIGN PATENT DOCUMENTS

| | | | |
|---|---|---|---|
| CN | 1402308 A | | 3/2003 |
| JP | 11-74261 | | 3/1999 |
| JP | 2003-158054 | | 5/2003 |
| JP | 2003-234270 | | 8/2003 |
| JP | 2004-172641 | | 6/2004 |
| JP | 2005-129698 | | 5/2005 |
| JP | 2005129698 | * | 5/2005 |
| JP | 2005-183638 | | 7/2005 |
| JP | 2005183638 | * | 7/2005 |

OTHER PUBLICATIONS

Notification of Reasons for Rejection mailed Jul. 1, 2008, from the Japanese Patent Office in a counterpart Japanese Application No. 2005-128230.

Notification of the First Office Action mailed Dec. 5, 2008, from the Chinese Patent Office in a counterpart Chinese Application No. 200610078614.7.

* cited by examiner

*Primary Examiner*—Shawntina Fuqua
(74) *Attorney, Agent, or Firm*—Finnegan, Henderson, Farabow, Garrett & Dunner, L.L.P.

(57) ABSTRACT

According to an aspect of the invention, there is provided a single substrate processing method which continuously heats substrates to be processed to which films containing solvents are applied, by use of a heating apparatus having an opening/closing mechanism, including supplying a gas containing a solvent contained in a film of a first substrate to be processed into the heating apparatus in a closed state of the opening/closing mechanism between processing of the first substrate to be processed and processing of a second substrate to be processed.

18 Claims, 9 Drawing Sheets

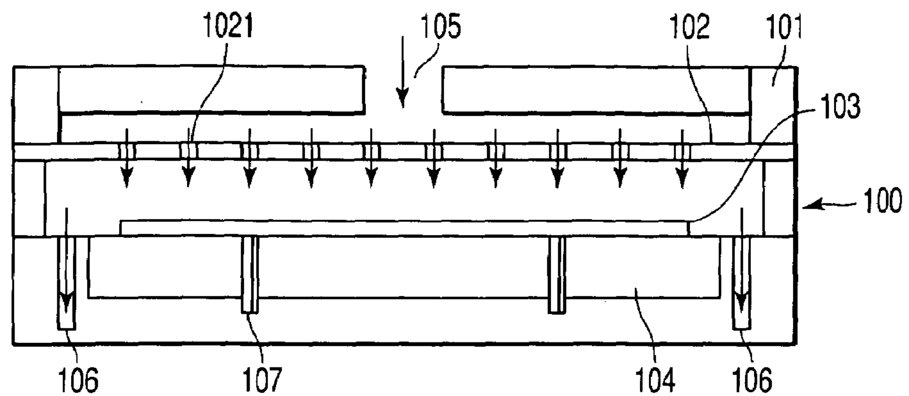
F I G. 1
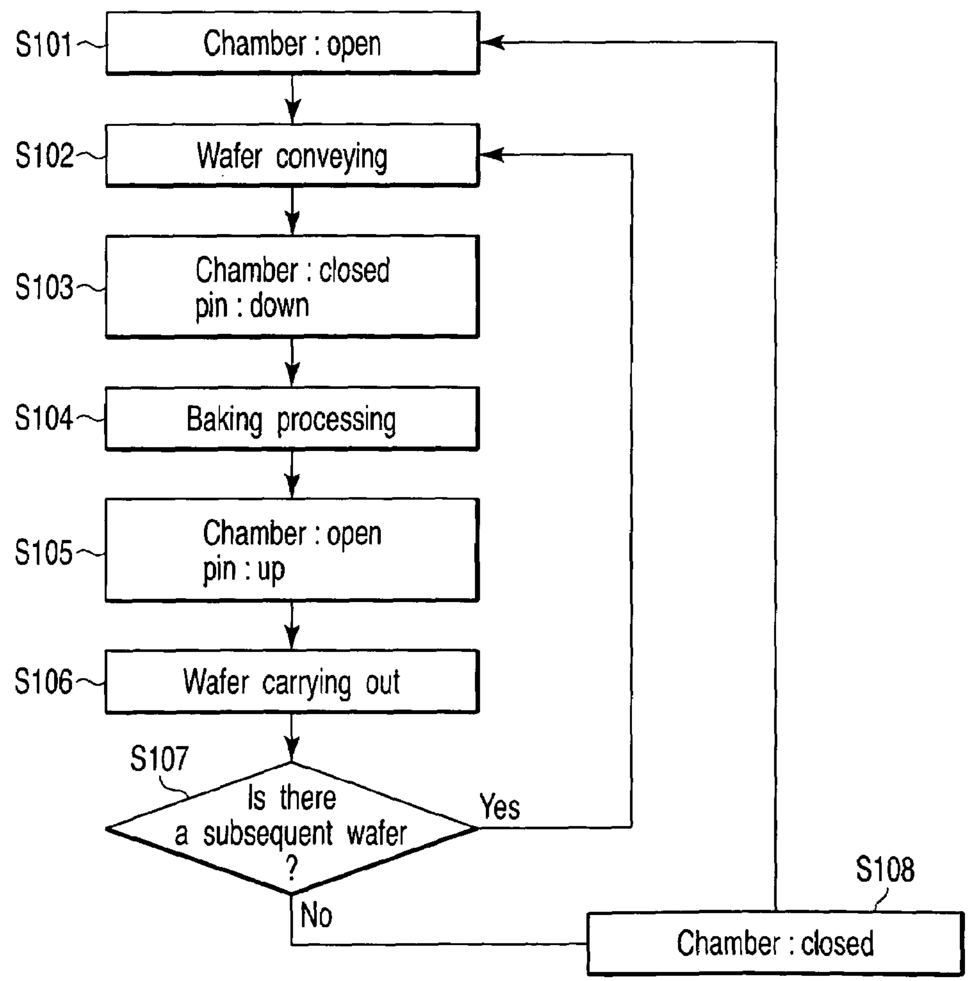
F I G. 2

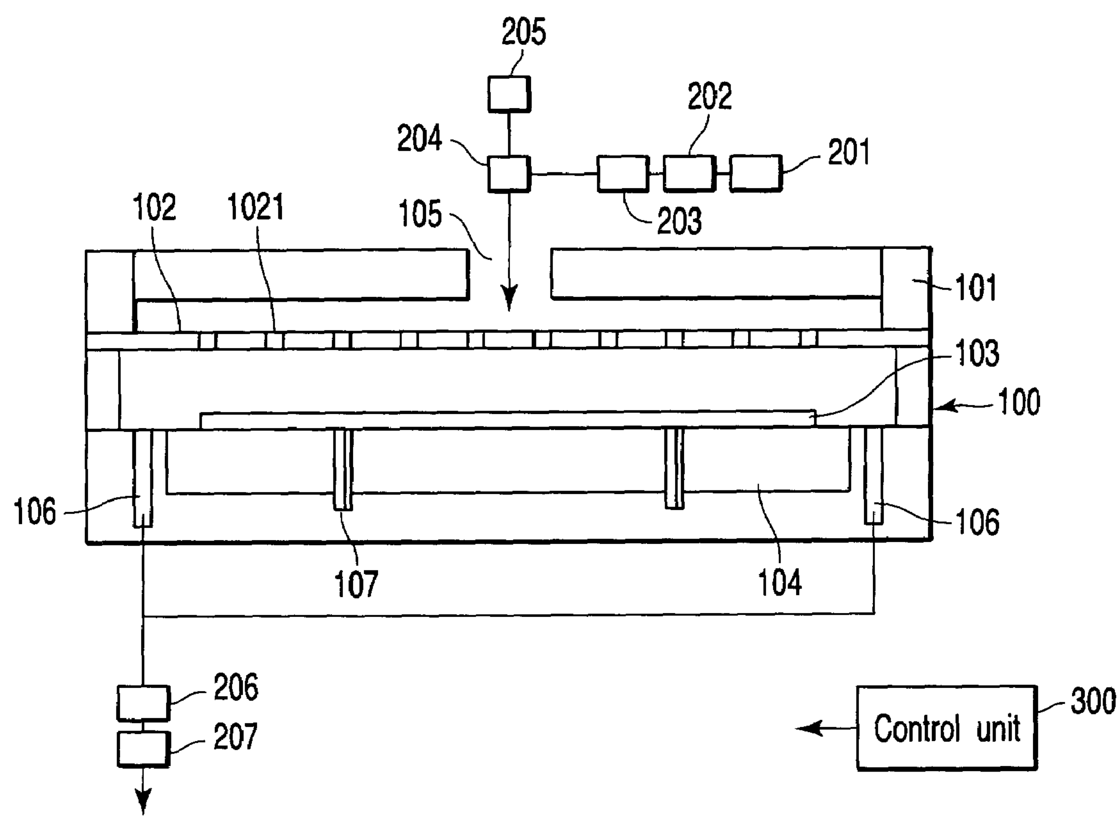
F I G. 3

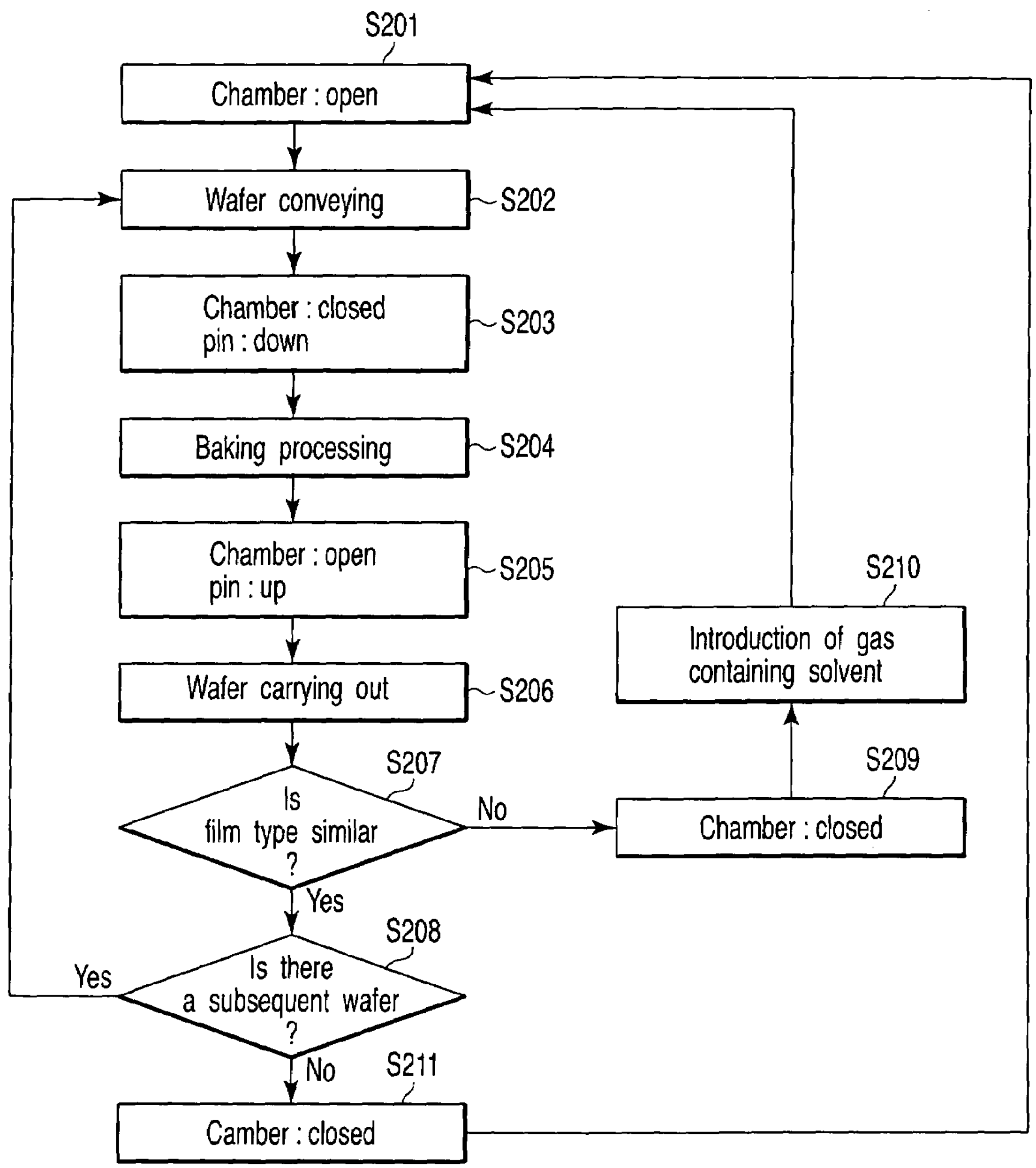
F I G. 4

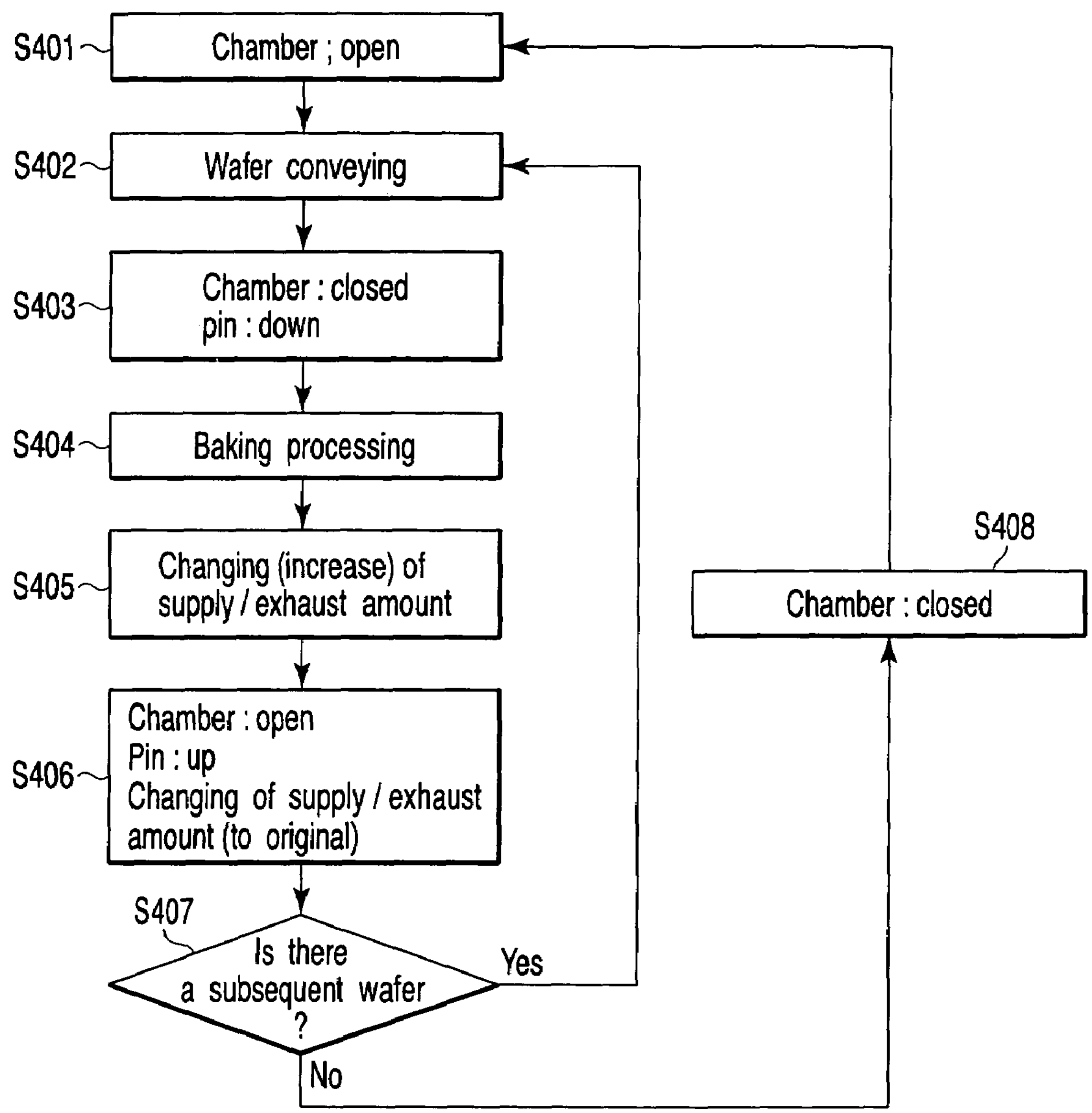
F I G. 6

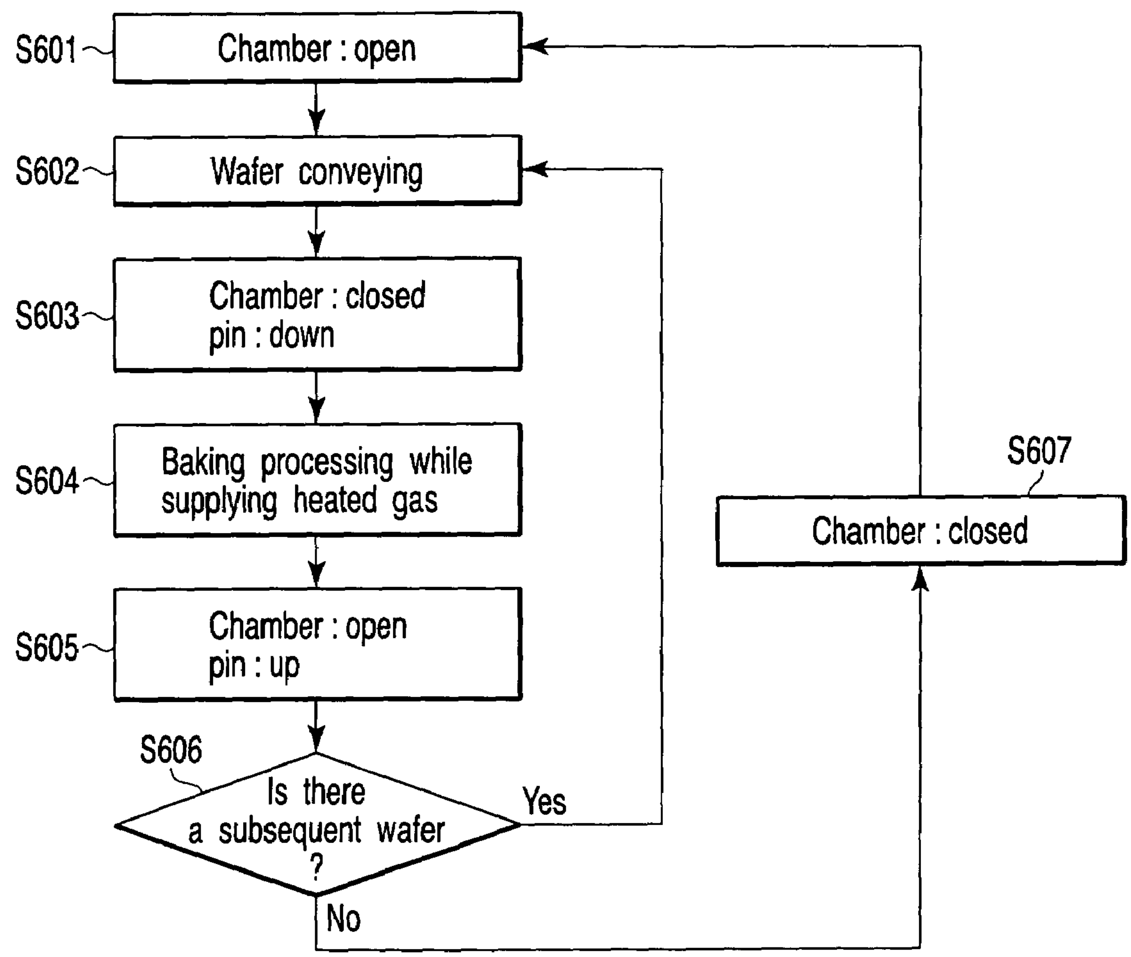
F I G. 8

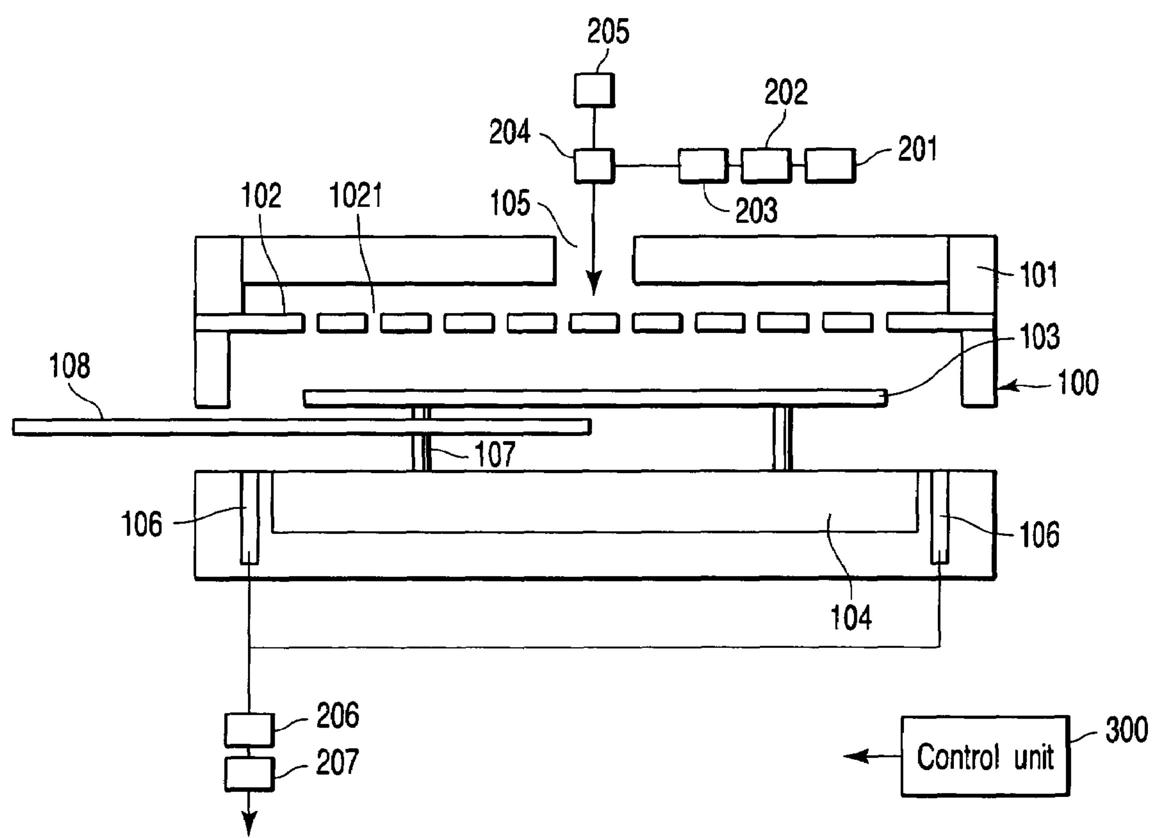
F I G. 1 0

SUBSTRATE PROCESSING METHOD AND MANUFACTURING METHOD OF SEMICONDUCTOR DEVICE

CROSS-REFERENCE TO RELATED APPLICATIONS

This application is based upon and claims the benefit of priority from prior Japanese Patent Application No. 2005-128230, filed Apr. 26, 2005, the entire contents of which are incorporated herein by reference.

BACKGROUND OF THE INVENTION

1. Field of the Invention

The present invention relates to a substrate processing method in an application and development processing apparatus for use in a lithography process of semiconductor device manufacturing, and a manufacturing method of a semiconductor device.

2. Description of the Related Art

In a photolithography process used in semiconductor integrated circuit manufacturing, an application and development processing apparatus executes application processing/baking processing of a reflection preventive film and application processing/baking processing of a resist for a substrate to be processed, an exposure apparatus executes processing of exposing patterns on a resist film formed on the substrate to be processed through a mask, and the application and development processing apparatus sequentially executes baking processing and development processing after the exposure.

In the baking processing executed after the application processing of the reflection prevention film and the resist, a solvent of a mainly applied chemical liquid is discharged into a heating apparatus, and removed from the apparatus by exhaust. In this case, however, in the case of the reflection prevention film of a high baking temperature, not only the solvent but also a sublimate are discharged into the apparatus, and stick again to the substrate to be processed, causing defects when the exhaust is unsufficient. Normally, these problems have been prevented by sufficiently exhausting the heating apparatus or preparing a composition to suppress a sublimate from an applied material.

However, chemical liquids for use in the lithography process have been recently diversified, and various solvents have been used, and baking processing has been executed for materials containing different solvents in one heating apparatus. As a result, when a solvent and a resin which is a material incompatible to the solvent are heated, particles are deposited and they stick to the substrate to be processed, so that defects are caused.

Jpn. Pat. Appln. KOKAI Publication No. 2004-172641 discloses a substrate processing apparatus which sprays a gas introduced into a chamber to a substrate through an opening formed in a gas spraying plate constituted of a curved plate which becomes convex or concave toward the substrate.

Jpn. Pat. Appln. KOKAI Publication No. 2003-158054 discloses a substrate processing apparatus which sprays a gas introduced into a chamber to a substrate through an opening formed in a gas spraying plate.

Jpn. Pat. Appln. KOKAI Publication No. 11-74261 discloses a method which includes a step of applying a polysiloxane application liquid to a substrate, a step of heating it in an atmosphere of the same solvent as that contained in the application liquid, and a step of gradually substituting an inactive gas for the atmosphere while heating it.

BRIEF SUMMARY OF THE INVENTION

According to an aspect of the invention, there is provided a single substrate processing method which continuously heats substrates to be processed to which films containing solvents are applied, by use of a heating apparatus having an opening/closing mechanism, comprising: supplying a gas containing a solvent contained in a film of a first substrate to be processed into the heating apparatus in a closed state of the opening/closing mechanism between processing of the first substrate to be processed and processing of a second substrate to be processed.

According to another aspect of the invention, there is provided a single substrate processing method which continuously heats substrates to be processed to which films containing solvents are applied, by use of a heating apparatus having an opening/closing mechanism, comprising: heating an upper board to prevent a temperature near the upper board in the heating apparatus from becoming equal to or less than a dew point of the solvents in a closed state of the opening/closing mechanism between processing of a first substrate to be processed and processing of a second substrate to be processed.

According to another aspect of the invention, there is provided a single substrate processing method which continuously heats substrates to be processed to which films containing solvents are applied, by use of a heating apparatus having an opening/closing mechanism, comprising: supplying or discharging a gas of a flow rate higher than that during the heating processing into the heating apparatus in a closed state of the opening/closing mechanism between processing of a first substrate to be processed and processing of a second substrate to be processed.

According to another aspect of the invention, there is provided a single substrate processing method which continuously heats substrates to be processed to which films containing solvents are applied, by use of a heating apparatus having an opening/closing mechanism, comprising: supplying a gas of a temperature lower than that during the heating processing into the heating apparatus in a closed state of the opening/closing mechanism between processing of a first substrate to be processed and processing of a second substrate to be processed.

According to another aspect of the invention, there is provided a single substrate processing method which continuously heats substrates to be processed to which films containing solvents are applied, by use of a heating apparatus having an opening/closing mechanism, comprising: carrying the substrates to be processed into the heating apparatus; closing the opening/closing mechanism; heating the substrates to be processed while supplying a gas of a predetermined supply flow rate and a predetermined discharge flow rate for a predetermined time; setting at least one of the supply flow rate and the discharge flow rate to be higher than that during the heating processing, and holding the substrates to be processed in the heating apparatus for a predetermined time; opening the opening/closing mechanism; and carrying out the substrates to be processed from the heating apparatus.

According to another aspect of the invention, there is provided a single substrate processing method which continuously heats substrates to be processed to which films containing solvents are applied, by use of a heating apparatus having an opening/closing mechanism, comprising: carrying the substrates to be processed into the heating apparatus; closing the opening/closing mechanism; heating the substrates to be processed while supplying a gas of a predetermined supply flow rate and a predetermined discharge flow rate for a predetermined time; decreasing a temperature of the gas for a predetermined time; opening the opening/closing mechanism; and carrying out the substrates to be processed from the heating apparatus.

According to another aspect of the invention, there is provided a single substrate processing method which continuously heats substrates to be processed to which films containing solvents are applied, by use of a heating apparatus having an opening/closing mechanism, comprising: carrying the substrates to be processed into the heating apparatus; closing the opening/closing mechanism; heating the substrates to be processed while supplying a gas of a predetermined supply flow rate and a predetermined discharge flow rate for a predetermined time; holding the substrates to be processed in the heating apparatus while supplying the solvents for a predetermined time; opening the opening/closing mechanism; and carrying out the substrates to be processed from the heating apparatus.

According to another aspect of the invention, there is provided a single substrate processing method which continuously heats substrates to be processed to which films containing solvents are applied, by use of a heating apparatus having an opening/closing mechanism, comprising: carrying the substrates to be processed into the heating apparatus; closing the opening/closing mechanism; heating the substrates to be processed while supplying a heated gas for a predetermined time; opening the opening/closing mechanism; and carrying out the substrates to be processed from the heating apparatus.

According to another aspect of the invention, there is provided a single substrate processing method which continuously heats substrates to be processed to which films containing solvents are applied, by use of a heating apparatus having an opening/closing mechanism, comprising: carrying the substrates to be processed into the heating apparatus; closing the opening/closing mechanism; heating the substrates to be processed while heating an upper board to prevent a temperature near the upper board in the heating apparatus from becoming equal to or less than a dew point of the solvents; opening the opening/closing mechanism; and carrying out the substrates to be processed from the heating apparatus.

According to another aspect of the invention, there is provided a single substrate processing method which continuously heats substrates to be processed to which films containing solvents are applied, by use of a heating apparatus having an opening/closing mechanism, comprising: carrying the substrates to be processed into the heating apparatus; closing the opening/closing mechanism; heating the substrates to be processed while supplying a gas of a predetermined supply flow rate and a predetermined discharge flow rate for a predetermined time; opening the opening/closing mechanism; and carrying out the substrates to be processed from the heating apparatus by an arm of a small thermal capacity or an arm heated to a predetermined temperature or higher.

According to another aspect of the invention, there is provided a manufacturing method of a semiconductor device by use of substrates singly processed by continuously heating the substrates to be processed to which films containing solvents are applied, by use of a heating apparatus having an opening/closing mechanism, comprising: supplying a gas containing a solvent contained in a film of a first substrate to be processed into the heating apparatus in a closed state of the opening/closing mechanism between processing of the first substrate to be processed and processing of a second substrate to be processed.

According to another aspect of the invention, there is provided a manufacturing method of a semiconductor device by use of substrates singly processed by continuously heating the substrates to be processed to which films containing solvents are applied, by use of a heating apparatus having an opening/closing mechanism, comprising: heating an upper board to prevent a temperature near the upper board in the heating apparatus from becoming equal to or less than a dew point of the solvents in a closed state of the opening/closing mechanism between processing of a first substrate to be processed and processing of a second substrate to be processed.

According to another aspect of the invention, there is provided a manufacturing method of a semiconductor device by use of substrates singly processed by continuously heating the substrates to be processed to which films containing solvents are applied, by use of a heating apparatus having an opening/closing mechanism, comprising: supplying or discharging a gas of a flow rate higher than that during the heating processing into the heating apparatus in a closed state of the opening/closing mechanism between processing of a first substrate to be processed and processing of a second substrate to be processed.

According to another aspect of the invention, there is provided a manufacturing method of a semiconductor device by use of substrates singly processed by continuously heating the substrates to be processed to which films containing solvents are applied, by use of a heating apparatus having an opening/closing mechanism, comprising: supplying a gas of a temperature lower than that during the heating processing into the heating apparatus in a closed state of the opening/closing mechanism between processing of a first substrate to be processed and processing of a second substrate to be processed.

BRIEF DESCRIPTION OF THE SEVERAL VIEWS OF THE DRAWING

FIG. 1 is a side sectional view showing a configuration of a general heating apparatus;

FIG. 2 is a flowchart showing a procedure of general baking processing;

FIG. 3 is a side sectional view showing a configuration of a heating apparatus according to a first embodiment;

FIG. 4 is a flowchart showing a procedure of baking processing according to the first embodiment;

FIG. 6 is a flowchart showing a procedure of baking processing according to a second embodiment;

FIG. 8 is a flowchart showing a procedure of baking processing according to a second modified example of the second embodiment;

FIG. 10 is a side sectional view showing a configuration of a heating apparatus according to the third modified example of the second embodiment.

DETAILED DESCRIPTION OF THE INVENTION

Figure 5:
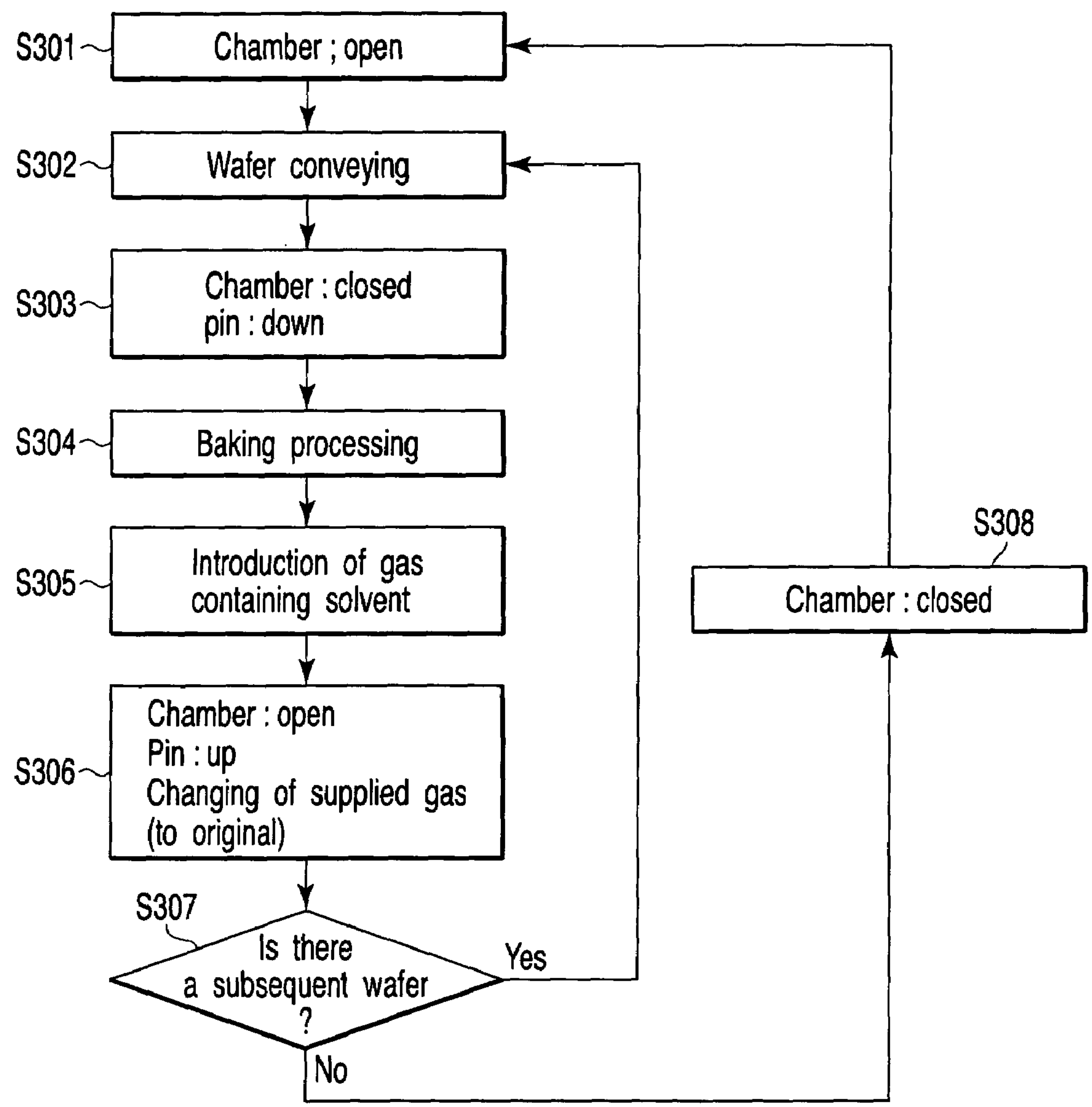
FIG. 5 is a flowchart showing a procedure of baking processing according to a modified example of the first embodiment.

The embodiments of the present invention will be described below with reference to the accompanying drawings.

In a photolithography process used in semiconductor integrated circuit manufacturing, an application and development processing apparatus executes application processing/baking processing of a reflection preventive film, and application processing/baking processing of a resist for a substrate to be processed (semiconductor substrate), an exposure apparatus executes processing of exposing patterns in a resist film formed on the substrate to be processed through a mask, and the application and development processing apparatus sequentially executes baking processing and development processing after the exposure.

A first embodiment will be described by way of case in which baking processing is performed for an organic reflection preventive film and a spin-on-glass (SOG) film by the same heating apparatus (bake unit). A solvent contained in a chemical liquid for the organic reflection preventive film and a solvent contained in a chemical liquid for the SOG film are different in kind.

FIG. 1 is a side sectional view showing a configuration of a general heating apparatus, in which a single substrate is processed, for use in baking processing of an organic reflection preventive film and a SOG film. A cap 101 is disposed on a chamber 100, and an upper board 102 is disposed in an upper part of the chamber 100. A hole 105 is formed in a center of the cap 101, and a plurality of holes 1021 are disposed in the upper board 102, e.g., spirally or radially. A plurality of support pins 107 are buried to move up and down in a hot plate 104 in a lower part of the chamber 100 on which a wafer (semiconductor substrate) 103 is mounted. A plurality of holes 106 are disposed in an end of the lower part of the chamber 100.

FIG. 2 is a flowchart showing a procedure of general baking processing. First, a film (resin film containing a solvent) is formed on a wafer 103 by rotational application. When the wafer 103 is conveyed to the heating apparatus, the cap 101 of the chamber 100 is opened in step S101, and the wafer 103 is carried into the chamber 100 in step S102. In step S103, the plurality of support pins 107 are lowered while supporting the wafer 103 from the lower side to close the cap 101 of the chamber. Baking processing is started in step S104.

During the baking processing, air (or $N_2$) is supplied through the hole 105 in the upper part of the chamber from the outside, and discharged from the plurality of holes 106 in the lower part of the chamber. After execution of the baking processing for a predetermined time, in step S105, the cap 101 of the chamber is opened to raise the support pins 107. The wafer 103 is carried out in step S106.

In step S107, when there is a subsequent wafer 103 which has arrived at the heating apparatus, the subsequent wafer 103 is carried into the chamber 100 simultaneously with carrying out the processed wafer 103, and the process of step S102 and after is repeated. When there is no subsequent wafer 103 which has arrived at the heating apparatus in step S107, in step S108, the process stands by in a closed state of the cap 101 of the chamber until a subsequent wafer 103 arrives, and then the process of step S101 and after is repeated for the subsequent wafer 103.

In the general heating apparatus, the organic reflection preventive film and the SOG film are repeatedly processed through the procedure shown in FIG. 2. It has been found that when the number of wafers to be processed is increased, defects occur on the wafers during baking processing of the organic reflection preventive film after a certain point. The inventors have investigated causes to discover that a sublimate of the SOG film sticks to the upper board of the heating apparatus, and solvents of the SOG film and the organic reflection preventive film are agglutinated into particles to stick to the wafers. An apparatus and a processing method for solving this problem will be described below.

Regarding the problem, processing (processing executed between processing of one wafer and processing of a subsequent wafer) below is performed by use of a heating apparatus shown in FIG. 3.

FIG. 3 is a side sectional view showing a configuration of the heating apparatus in which a single substrate is processed according to a first embodiment. In FIG. 3, parts similar to those of FIG. 1 are denoted by similar reference numerals. A cap 101 (opening/closing mechanism) is disposed on a chamber 100, and an upper board 102 is disposed in an upper part of the chamber 100. A hole 105 is formed in a center of the cap 101, and a plurality of holes 1021 are formed in the upper board 102, e.g., spirally or radially. A plurality of support pins 107 are buried to move up and down in a hot plate 104 in a lower part of the chamber 100 on which a wafer (semiconductor substrate, or substrate to be processed) 103 is mounted, and a plurality of holes 1016 are formed in an end of the lower part of the chamber 100.

A gas supply source 201 is connected through a pipe to a pressure adjusting mechanism 202, a temperature adjusting mechanism 203 and a valve 204, and a solvent atmosphere generation mechanism 205 is connected to the valve 204. An exhaust mechanism 207 is connected to each hole through an exhaust amount adjusting mechanism 206. A control unit 300 constituted of a computer is connected to the gas supply source 201, the pressure adjusting mechanism 202, the temperature adjusting mechanism 203, the valve 204, the solvent atmosphere generation mechanism 205, the exhaust amount adjusting mechanism 206, and the exhaust mechanism 207.

FIG. 4 is a flowchart showing a procedure of baking processing according to the first embodiment. First, a film (resin film containing a solvent) is formed on a wafer 103 by rotational application. When the wafer 103 is conveyed to the heating apparatus, the cap 101 of the chamber 100 is opened under the control of the control unit 300 in step S201, and the wafer 103 is carried into the chamber 100 in step S202. In step S203, under the control of the control unit 300, the plurality of support pins 107 are lowered while supporting the wafer 103 from the lower side to close the cap 101 of the chamber. Baking processing is started in step S204.

During the baking processing, under the control of the control unit 300, air (or $N_2$) from the gas supply source 201 is adjusted for pressure by the pressure adjusting mechanism 202. After a temperature is adjusted by the temperature adjusting mechanism 203, the air is supplied at a predetermined flow rate from the hole 105 in the upper part of the chamber through the valve 204, and discharged from the plurality of holes 106 in the lower part of the chamber by a predetermined flow rate.

After execution of the baking processing for a predetermined time, in step S205, the cap 101 of the chamber is opened under the control of the control unit 300 to raise the support pins 107. The wafer 103 is carried out in step S206.

If a film of a subsequent wafer 103 is similar in kind to that of the current wafer 103 in step S207, and if there is a subsequent wafer 103 which has arrived at the heating apparatus in step S208, under the control of the control unit 300, the subsequent wafer 103 is carried into the chamber 100 simultaneously with carrying out the current processed wafer 103, and the process of step S202 and after is repeated.

If the film of the subsequent wafer 103 is different in kind from that of the current wafer 103 in step S207, under the control of the control unit 300, in step S209, the process stands by in a closed state of the cap 101 of the chamber until a subsequent wafer 103 arrives and then, in step S210, a solvent similar to that contained in the film of the current processed wafer 103 is contained in the air (or $N_2$) by the solvent atmosphere generation mechanism 205. According to the embodiment, at least solvents contained in the organic reflection preventive film and the SOG film are contained in air (or $N_2$).

Subsequently, under the control of the control unit 300, the process of step S201 and after is executed for the subsequent wafer 103.

If there is no subsequent wafer 103 which has arrived at the heating apparatus, in step S211, under the control of the control unit 300, the process stands by in the closed state of the cap 101 of the chamber until a subsequent wafer 103 arrives, and the process of step S201 and after is executed for the subsequent wafer 103.

Accordingly, when the film of the subsequent wafer 103 is different in kind from that of the current wafer 103, it is possible to eliminate substances which become the cause of particles during the processing of the subsequent wafer 103 by dissolving sublimates, which is stuck to the upper board 102 when the current wafer 103 is processed, in the solvent atmosphere supplied by the solvent atmosphere generation mechanism 205 and discharging them through the holes 106. Hence, defects on the subsequent wafer 103 can be reduced. According to the embodiment, the solvent atmosphere is supplied each time the film kind of the current wafer 103 changes. However, the solvent atmosphere may be supplied for each wafer 103 irrespective of a film kind.

Lastly, a semiconductor device is manufactured by using the processed wafers 103.

FIG. 5 is a flowchart showing a procedure of baking processing according to a modified example of the first embodiment. First, a film (resin film containing a solvent) is formed on a wafer 103 by rotational application. When the wafer 103 is conveyed to a heating apparatus shown in FIG. 3, a cap 101 of a chamber 100 is opened under control of a control unit 300 in step S301, and the wafer 103 is carried into the chamber 100 in step S302. In step S303, under the control of the control unit 300, a plurality of support pins 107 are lowered while supporting the wafer 103 from the lower side to close the cap 101 of the chamber. Baking processing is started in step S304.

During the baking processing, under the control of the control unit 300, air (or $N_2$) from a gas supply source 201 is adjusted for pressure by a pressure adjusting mechanism 202. After a temperature is adjusted by a temperature adjusting mechanism 203, the air is supplied by a predetermined flow rate from a hole 105 in the upper part of the chamber through a valve 204, and discharged from a plurality of holes 106 in the lower part of the chamber by a predetermined flow rate.

After execution of the baking processing for a predetermined time, in step S305, under the control of the control unit 300, a solvent atmosphere generation mechanism 205 is adjusted, a gas containing a solvent is supplied from the hole 105 in the upper part of the chamber through the valve 204, and discharged from the plurality of holes 106 in the lower part of the chamber. In step S306, under the control of the control unit 300, after a passage of predetermined time, the cap 101 of the chamber is opened to raise the support pins 107, and the wafer 103 is carried out. Subsequently, under the control of the control unit 300, the solvent atmosphere generation mechanism 205 is adjusted to return the gas to be supplied to the original.

If there is a subsequent wafer 103 which has arrived at the heating apparatus, under the control of the control unit 300, the subsequent wafer 103 is carried into the chamber 100 simultaneously with carrying out the current processed wafer 103, and the process of step S302 and after is repeated.

If there is no subsequent wafer 103 which has arrived at the heating apparatus in step S307, in step S308, under the control of the control unit 300, the process stands by in the closed state of the cap 101 of the chamber until a subsequent wafer 103 arrives, and the process of step S301 and after is executed for the subsequent wafer 103.

Thus, after the baking processing, before the cap 101 of the chamber is opened, the solvent contained in the film of the processing target wafer 103 is contained in the air by the solvent atmosphere generation mechanism 205, and introduced into the chamber 100 to perform baking processing for a predetermined time. According to the embodiment, preferably, a concentration of solvents in the air should be set equal to or lower than a saturated concentration to prevent deposition thereof.

Lastly, a semiconductor device is manufactured by using the processed wafers 103.

According to the first embodiment, when the wafers are singly and continuously heated, substances which become the cause of particles are eliminated by supplying the gas containing the solvents to the heating apparatus to evacuate the same, between the processing of one wafer and the processing of a subsequent wafer. However, the upper board 102 may be heated in the closed state of the cap 101 of the chamber between the processing of one wafer and the processing of a subsequent wafer, and substances stuck to the upper board 102 may be sublimated to recover them by exhaust. In this case, to prevent redeposition, a temperature near the upper board 102 should not preferably be equal to or less than a dew point of the solvents.

According to another embodiment, the exhaust may be carried out with a large exhaust amount between the processing of one wafer and the processing of a subsequent wafer to eliminate substances which become the cause of particles. Besides, a gas higher in temperature than that during the baking processing may be supplied, and substances which become the cause of particles may be sublimated to be recovered by the exhaust. In this case, to increase a recovery rate, an exhaust amount may be set higher that that in the case of normal substrate heating processing.

The first embodiment has been described by way of example in which the organic reflection preventive film and the SOG film are subjected to baking processing. However, the embodiment can be applied even when a sublimate becomes particles to cause a problem during baking processing of one of the films. According to the embodiment, the cap 101 of the chamber 100 of the heating apparatus is opened/closed. However, a shutter (not shown) of the heating apparatus may be opened/closed instead.

The first embodiment has been describe by way of example in which the sticking of particles becoming a problem when the SOG film and the organic reflection preventive film are processed by the same heating apparatus is prevented by executing additional processing between the processing of one wafer and the processing of a subsequent wafer. According to a second embodiment, sticking of particles becoming a problem when an organic reflection preventive film is subjected to baking processing is prevented by contriving wafer baking processing.

By use of the general heating apparatus shown in FIG. 1, the organic reflection preventive film is repeatedly processed through the procedure shown in FIG. 2. It has been found that a problem of sticking particles occurs on the wafers during baking processing of the organic reflection preventive film after a certain point. The inventors have investigated causes to discover that a sublimate of the organic reflection prevention film sticks to an upper board 102, and the stuck substance, a solvent of the organic reflection preventive film and the sublimate are agglutinated into particles to stick to the wafers. An apparatus and a processing method for solving this problem will be described below.

FIG. 6 is a flowchart showing a procedure of baking processing according to the second embodiment. First, a film (resin film containing a solvent) is formed on a wafer 103 by rotational application. When the wafer 103 is conveyed to the heating apparatus shown in FIG. 3, a cap 101 of a chamber 100 is opened under control of a control unit 300 in step S401, and the wafer 103 is carried into the chamber 100 in step S402. In step S403, under the control of the control unit 300, a plurality of support pins 107 are lowered while supporting the wafer 103 from the lower side to close the cap 101 of the chamber. Baking processing is started in step S404.

During the baking processing, under the control of the control unit 300, air (or $N_2$) from a gas supply source 201 is adjusted for pressure by a pressure adjusting mechanism 202. After a temperature is adjusted by a temperature adjusting mechanism 203, the air is supplied by a predetermined flow rate from a hole 105 in the upper part of the chamber through a valve 204, and discharged from a plurality of holes 106 in the lower part of the chamber by a predetermined flow rate.

After execution of the baking processing for a predetermined time, in step S405, under the control of the control unit 300, the air supply source 201 is adjusted to increase at least one of an air supply amount or an exhaust amount. In step S406, under the control of the control unit 300, the cap 101 of the chamber is opened to raise the support pins 107 after a passage of predetermined time, and the wafer 103 is carried out. Subsequently, under the control of the control unit 300, the air supply source 201 is adjusted to return the air supply amount/exhaust amount to the original.

If there is a subsequent wafer 103 which has arrived at the heating apparatus in step S407, under the control of the control unit 300, the subsequent wafer 103 is carried into the chamber 100 simultaneously with carrying out the current processed wafer 103, and the process of step S402 and after is repeated.

If there is no subsequent wafer 103 which has arrived at the heating apparatus in step S407, in step S408, under the control of the control unit 300, the process stands by in the closed state of the cap 101 of the chamber until a subsequent wafer 103 arrives, and the process of step S401 and after is executed for the subsequent wafer 103.

Thus, a substance generated in the fist half of the wafer processing can be eliminated by increasing an air supply amount/exhaust amount in the latter half of the processing. As the exhaust amount is not increased in the first half of the processing, the processing can be performed in a state of maintaining a temperature uniform in the chamber. Hence, it is possible to reduce defects on the wafers while maintaining the uniform temperature. According to the embodiment, the air supply amount/exhaust amount is increased before the support pins 17 are raised. However, effects will be similar if it is increased after the support pins 17 are raised.

Lastly, a semiconductor device is manufactured by using the processed wafers 103.

Figure 7:
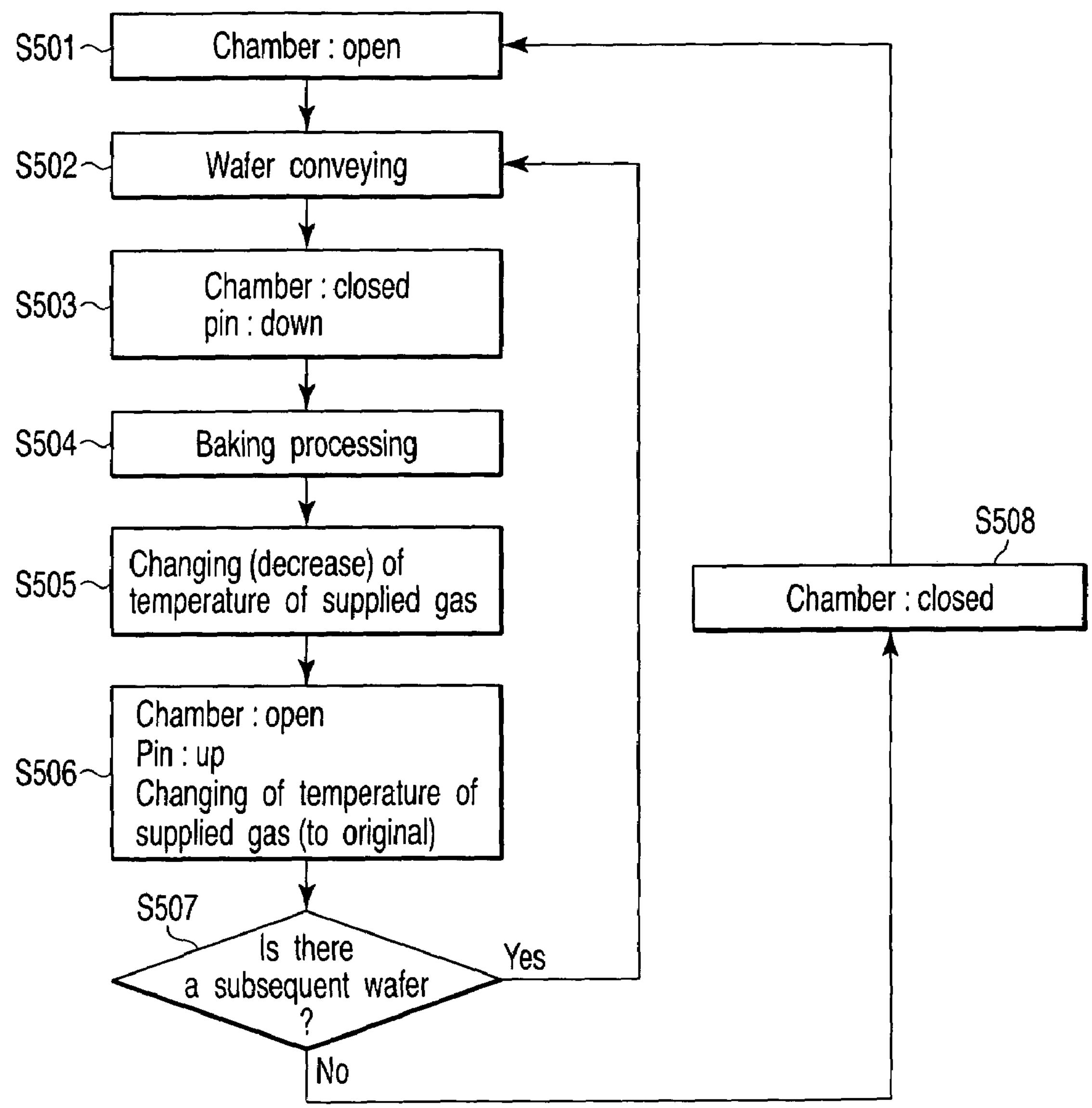
FIG. 7 is a flowchart showing a procedure of baking processing according to a first modified example of the second embodiment.

FIG. 7 is a flowchart showing a procedure of baking processing according to a first modified exampled of the second embodiment. First, a film (resin film containing a solvent) is formed on a wafer 103 by rotational application. When the wafer 103 is conveyed to the heating apparatus shown in FIG. 3, a cap 101 of a chamber 100 is opened under control of a control unit 300 in step S501, and the wafer 103 is carried into the chamber 100 in step S502. In step S503, under the control of the control unit 300, a plurality of support pins 107 are lowered while supporting the wafer 103 from the lower side to close the cap 101 of the chamber. Baking processing is started in step S504.

During the baking processing, under the control of the control unit 300, air (or $N_2$) from a gas supply source 201 is adjusted for pressure by a pressure adjusting mechanism 202. After a temperature is adjusted by a temperature adjusting mechanism 203, the air is supplied by a predetermined flow rate from a hole 105 in the upper part of the chamber through a valve 204, and discharged from a plurality of holes 106 in the lower part of the chamber by a predetermined flow rate.

After execution of the baking processing for a predetermined time, in step S505, under the control of the control unit 300, a temperature of a gas supplied into the chamber 100 is adjusted by a temperature adjusting mechanism 203 to gradually decrease a temperature in the chamber 100. In step S506, under the control of the control unit 300, the cap 101 of the chamber is opened to raise the support pins 107 after a passage of predetermined time (time at which the temperature in the chamber 100 becomes nearly equal to that of external air), and the wafer 103 is carried out. Subsequently, under the control of the control unit 300, the temperature adjusting mechanism 203 is adjusted to return the temperature of the gas supplied into the chamber 100 to the original.

If there is a subsequent wafer 103 which has arrived at the heating apparatus in step S507, under the control of the control unit 300, the subsequent wafer 103 is carried into the chamber 100 simultaneously with carrying out the current processed wafer 103, and the process of step S502 and after is repeated.

If there is no subsequent wafer 103 which has arrived at the heating apparatus in step S507, in step S508, under the control of the control unit 300, the process stands by in the closed state of the cap 101 of the chamber until a subsequent wafer 103 arrives, and the process of step S501 and after is executed for the subsequent wafer 103.

Thus, as a sudden change in temperature of the chamber 100 can be reduced, generation of particles caused by sudden cooling can be reduced. Hence, it is possible to reduce defects on the wafers. According to the embodiment, the temperature of the gas supply is changed before the support pins 17 are raised. However, effects will be similar if it is changed after the support pins 17 are raised. Preferably, in the temperature adjustment of step S505, the gas temperature should be set higher than a dew point of the solvent.

Lastly, a semiconductor device is manufactured by using the processed wafers 103.

FIG. 8 is a flowchart showing a procedure of baking processing according to a second modified example of the second embodiment. First, a film (resin film containing a solvent) is formed on a wafer 103 by rotational application. When the wafer 103 is conveyed to the heating apparatus shown in FIG. 3, a cap 101 of a chamber 100 is opened under control of a control unit 300 in step S601, and the wafer 103 is carried into the chamber 100 in step S602. In step S603, under the control of the control unit 300, a plurality of support pins 107 are lowered while supporting the wafer 103 from the lower side to close the cap 101 of the chamber. Baking processing is started in step S604.

During the baking processing, under the control of the control unit 300, air (or $N_2$) from a gas supply source 201 is adjusted for pressure by a pressure adjusting mechanism 202. After heating by a temperature adjusting mechanism 203, the air is supplied by a predetermined flow rate from a hole 105 in the upper part of the chamber through a valve 204, and discharged from a plurality of holes 106 in the lower part of the chamber by a predetermined flow rate.

After execution of the baking processing for a predetermined time, in step S605, under the control of the control unit 300, the cap 101 of the chamber is opened to raise the support pins 107, and the wafer 103 is carried out.

If there is a subsequent wafer 103 which has arrived at the heating apparatus in step S606, under the control of the control unit 300, the subsequent wafer 103 is carried into the chamber 100 simultaneously with carrying out the current processed wafer 103, and the process of step S602 and after is repeated.

If there is no subsequent wafer 103 which has not arrived at the heating apparatus in step S606, in step S607, under the control of the control unit 300, the process stands by in the closed state of the cap 101 of the chamber until a subsequent wafer 103 arrives, and the process of step S601 and after is executed for the subsequent wafer 103.

Preferably, the temperature of the heated air (or $N_2$) should be higher than a dew point of the solvent. As a temperature of a gas in the chamber 100 does not become equal to or less than the dew point of the solvent by introducing a gas of this temperature, generation of particles can be reduced. Hence, it is possible to reduce defects on the wafers.

Lastly, a semiconductor device is manufactured by using the processed wafers 103.

Figure 9:
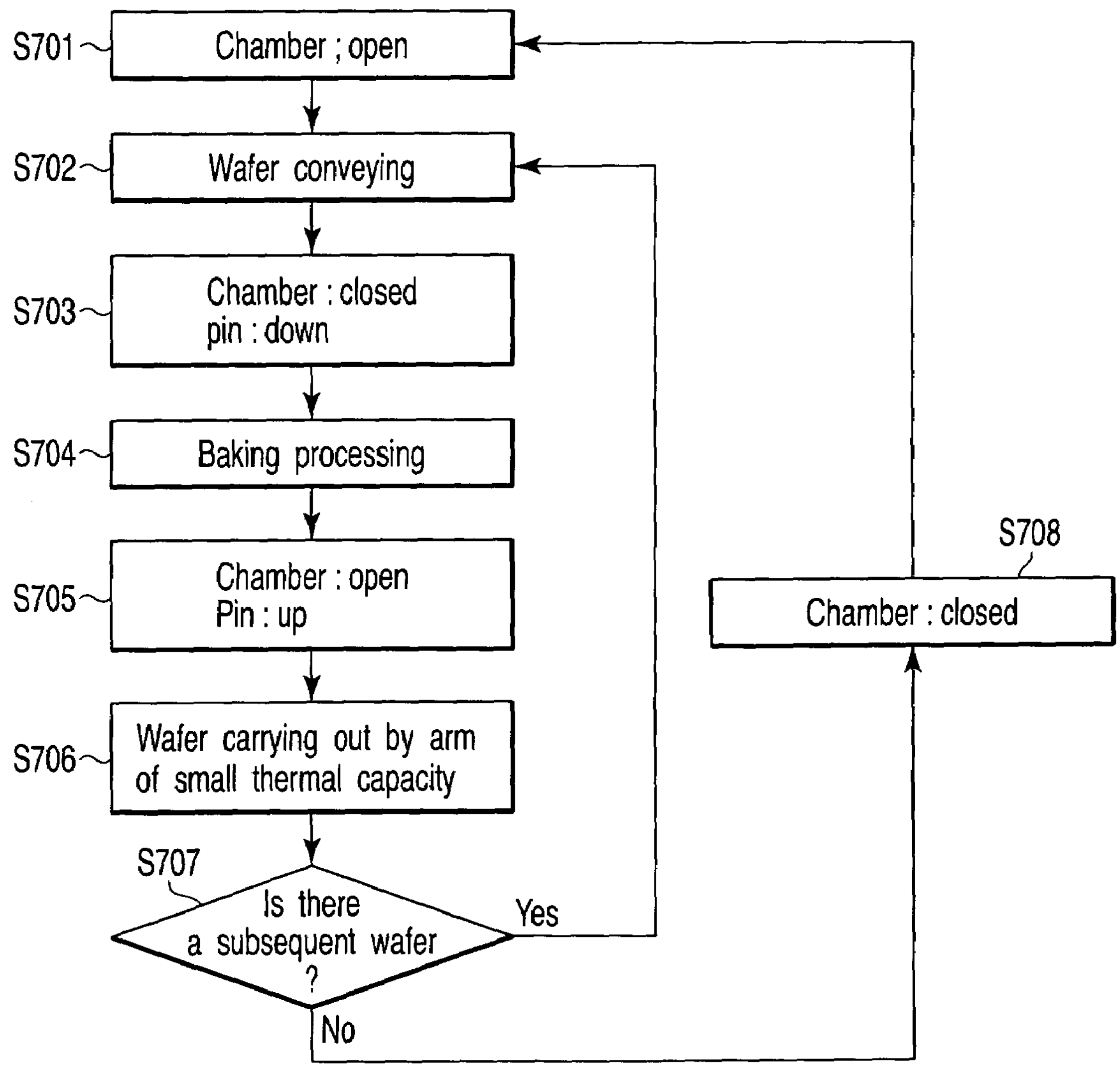
FIG. 9 is a flowchart showing a procedure of baking processing according to a third modified example of the second embodiment.

FIG. 9 is a flowchart showing a procedure of baking processing according to a third modified example of the second embodiment. First, a film (resin film containing a solvent) is formed on a wafer 103 by rotational application. When the wafer 103 is conveyed to the heating apparatus, a cap 101 of a chamber 100 is opened under control of a control unit 300 in step S701, and the wafer 103 is carried into the chamber 100 in step S702. In step S703, under the control of the control unit 300, a plurality of support pins 107 are lowered while supporting the wafer 103 from the lower side to close the cap 101 of the chamber. Baking processing is started in step S704.

During the baking processing, under the control of the control unit 300, air (or $N_2$) from a gas supply source 201 is adjusted for pressure by a pressure adjusting mechanism 202. After a temperature is adjusted by a temperature adjusting mechanism 203, the air is supplied by a predetermined flow rate from a hole 105 in the upper part of the chamber through a valve 204, and discharged from a plurality of holes 106 in the lower part of the chamber by a predetermined flow rate.

After execution of the baking processing for a predetermined time, in step S705 as shown in FIG. 10, under the control of the control unit 300, the cap 101 of the chamber is opened to raise the support pins 107, and the wafer 103 is carried out by an arm 108 of a small thermal capacity in step S706.

If there is a subsequent wafer 103 which has arrived at the heating apparatus in step S707, under the control of the control unit 300, the subsequent wafer 103 is carried into the chamber 100 simultaneously with carrying out the current processed wafer 103, and the process of step S702 and after is repeated.

If there is no subsequent wafer 103 which has not arrived at the heating apparatus in step S707, in step S708, under the control of the control unit 300, the process stands by in the closed state of the cap 101 of the chamber until a subsequent wafer 103 arrives, and the process of step S701 and after is executed for the subsequent wafer 103.

Preferably, the thermal capacity of the arm should be set to prevent a temperature of a gas near the wafer 103 from becoming equal to or less than a dew point of a solvent when the wafer 103 is mounted on the arm. An arm heated to a predetermined temperature or higher may be used to prevent the above temperature from becoming equal to or less than the dew point of the solvent. As the temperature near the wafer 103 does not become equal to less than the dew point of the solvent, generation of particles can be prevented. Hence, it is possible to reduce defects on the wafers.

Lastly, a semiconductor device is manufactured by using the processed wafers 103.

The second embodiment has been described by taking the example of the heating apparatus which heats the organic reflection preventive film alone when the wafers are singly and continuously heated. However, the embodiment can be applied when a sublimate becomes particles to cause a problem in a heating apparatus for processing plural kinds of films. According to the embodiment, the cap 101 of the chamber 100 of the heating apparatus is opened/closed. However, a shutter (not shown) of the heating apparatus may be opened/closed instead.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A single substrate processing method which continuously heats substrates to be processed to which films containing solvents are applied, by use of a heating apparatus having an opening/closing mechanism, comprising:

supplying a gas containing a solvent contained in a film of a first substrate to be processed into the heating apparatus in a closed state of the opening/closing mechanism between processing of the first substrate to be processed and processing of a second substrate to be processed.

2. The method according to claim 1, wherein a concentration of the solvent contained in the gas is equal to or less than a saturated concentration.

3. The method according to claim 1, wherein the film of the first substrate to be processed is different in kind from that of the second substrate to be processed.

4. A single substrate processing method which continuously heats substrates to be processed to which films containing solvents are applied, by use of a heating apparatus having an opening/closing mechanism, comprising:

heating an upper board to prevent a temperature near the upper board in the heating apparatus from becoming equal to or less than a dew point of the solvents in a closed state of the opening/closing mechanism between processing of a first substrate to be processed and processing of a second substrate to be processed.

5. A single substrate processing method which continuously heats substrates to be processed to which films containing solvents are applied, by use of a heating apparatus having an opening/closing mechanism, comprising:

supplying or discharging a gas of a flow rate higher than that during the heating processing into the heating apparatus in a closed state of the opening/closing mechanism between processing of a first substrate to be processed and processing of a second substrate to be processed.

6. A single substrate processing method which continuously heats substrates to be processed to which films containing solvents are applied, by use of a heating apparatus having an opening/closing mechanism, comprising:

supplying a gas of a temperature lower than that during the heating processing into the heating apparatus in a closed state of the opening/closing mechanism between processing of a first substrate to be processed and processing of a second substrate to be processed.

7. A single substrate processing method which continuously heats substrates to be processed to which films containing solvents are applied, by use of a heating apparatus having an opening/closing mechanism, comprising:

carrying the substrates to be processed into the heating apparatus;

closing the opening/closing mechanism;

heating the substrates to be processed while supplying a gas of a predetermined supply flow rate and a predetermined discharge flow rate for a predetermined time;

setting at least one of the supply flow rate and the discharge flow rate to be higher than that during the heating processing, and holding the substrates to be processed in the heating apparatus for a predetermined time;

opening the opening/closing mechanism; and carrying out the substrates to be processed from the heating apparatus.

8. A single substrate processing method which continuously heats substrates to be processed to which films containing solvents are applied, by use of a heating apparatus having an opening/closing mechanism, comprising:

carrying the substrates to be processed into the heating apparatus;

closing the opening/closing mechanism;

heating the substrates to be processed while supplying a gas of a predetermined supply flow rate and a predetermined discharge flow rate for a predetermined time;

decreasing a temperature of the gas for a predetermined time;

opening the opening/closing mechanism; and carrying out the substrates to be processed from the heating apparatus.

9. The method according to claim 8, wherein the temperature of the gas is higher than a dew point of the solvents.

10. A single substrate processing method which continuously heats substrates to be processed to which films containing solvents are applied, by use of a heating apparatus having an opening/closing mechanism, comprising:

carrying the substrates to be processed into the heating apparatus;

closing the opening/closing mechanism;

heating the substrates to be processed while supplying a gas of a predetermined supply flow rate and a predetermined discharge flow rate for a predetermined time;

holding the substrates to be processed in the heating apparatus while supplying the solvents for a predetermined time;

opening the opening/closing mechanism; and carrying out the substrates to be processed from the heating apparatus.

11. A single substrate processing method which continuously heats substrates to be processed to which films containing solvents are applied, by use of a heating apparatus having an opening/closing mechanism, comprising:

carrying the substrates to be processed into the heating apparatus;

closing the opening/closing mechanism;

heating the substrates to be processed while supplying a heated gas for a predetermined time;

opening the opening/closing mechanism; and carrying out the substrates to be processed from the heating apparatus, wherein a temperature of the gas is higher than a dew point of the solvents.

12. A single substrate processing method which continuously heats substrates to be processed to which films containing solvents are applied, by use of a heating apparatus having an opening/closing mechanism, comprising:

carrying the substrates to be processed into the heating apparatus;

closing the opening/closing mechanism;

heating the substrates to be processed while heating an upper board to prevent a temperature near the upper board in the heating apparatus from becoming equal to or less than a dew point of the solvents;

opening the opening/closing mechanism; and carrying out the substrates to be processed from the heating apparatus.

13. A single substrate processing method which continuously heats substrates to be processed to which films containing solvents are applied, by use of a heating apparatus having an opening/closing mechanism, comprising:

carrying the substrates to be processed into the heating apparatus;

closing the opening/closing mechanism;

heating the substrates to be processed while supplying a gas of a predetermined supply flow rate and a predetermined discharge flow rate for a predetermined time;

opening the opening/closing mechanism; and carrying out the substrates to be processed from the heating apparatus by an arm of a small thermal capacity or an arm heated to a predetermined temperature or higher, wherein the thermal capacity or the predetermined temperature is set to prevent a temperature of the gas near the substrates to be processed from becoming equal to or less than a dew point of the solvents when the substrates to be processed are mounted on the arm.

14. A single substrate processing method which continuously heats substrates to be processed to which films containing solvents are applied, by use of a heating apparatus having an opening/closing mechanism, comprising:

carrying the substrates to be processed into the heating apparatus;

closing the opening/closing mechanism;

heating the substrates to be processed while supplying a gas of a predetermined supply flow rate and a predetermined discharge flow rate for a predetermined time;

opening the opening/closing mechanism; and carrying out the substrates to be processed from the heating apparatus by an arm of a small thermal capacity or an arm heated to a predetermined temperature or higher, wherein the opening/closing mechanism is a shutter or a cap of a chamber.

15. A manufacturing method of a semiconductor device by use of substrates singly processed by continuously heating the substrates to be processed to which films containing solvents are applied, by use of a heating apparatus having an opening/closing mechanism, comprising:

supplying a gas containing a solvent contained in a film of a first substrate to be processed into the heating apparatus in a closed state of the opening/closing mechanism between processing of the first substrate to be processed and processing of a second substrate to be processed.

16. A manufacturing method of a semiconductor device by use of substrates singly processed by continuously heating the substrates to be processed to which films containing solvents are applied, by use of a heating apparatus having an opening/closing mechanism, comprising:

heating an upper board to prevent a temperature near the upper board in the heating apparatus from becoming equal to or less than a dew point of the solvents in a closed state of the opening/closing mechanism between processing of a first substrate to be processed and processing of a second substrate to be processed.

17. A manufacturing method of a semiconductor device by use of substrates singly processed by continuously heating the substrates to be processed to which films containing solvents are applied, by use of a heating apparatus having an opening/closing mechanism, comprising:

supplying or discharging a gas of a flow rate higher than that during the heating processing into the heating apparatus in a closed state of the opening/closing mechanism between processing of a first substrate to be processed and processing of a second substrate to be processed.

18. A manufacturing method of a semiconductor device by use of substrates singly processed by continuously heating the substrates to be processed to which films containing solvents are applied, by use of a heating apparatus having an opening/closing mechanism, comprising:

supplying a gas of a temperature lower than that during the heating processing into the heating apparatus in a closed state of the opening/closing mechanism between processing of a first substrate to be processed and processing of a second substrate to be processed.

* * * * *